United States Patent [19]

Bache

[11] 4,416,912
[45] Nov. 22, 1983

[54] FORMATION OF COATINGS ON CUTTING EDGES

[75] Inventor: Roger J. Bache, Reading, England

[73] Assignee: The Gillette Company, Boston, Mass.

[21] Appl. No.: 197,351

[22] Filed: Oct. 15, 1980

[30] Foreign Application Priority Data

Oct. 13, 1979 [GB] United Kingdom ............... 7935706

[51] Int. Cl.³ .............................................. B05D 1/04
[52] U.S. Cl. .................................... 427/13; 427/14.1; 427/50; 427/248.1; 427/249; 427/250; 427/252
[58] Field of Search ................... 427/13, 14.1, 248.1, 427/249, 38, 250, 252, 255.1, 255.2, 50; 30/346.53, 346.55, 346.5

[56] References Cited

U.S. PATENT DOCUMENTS

| | | | |
|---|---|---|---|
| 2,843,542 | 7/1958 | Callahan | 204/192 |
| 3,756,847 | 9/1973 | Leibowitz et al. | 427/13 |
| 3,757,734 | 9/1973 | Fischbein | 427/13 X |
| 3,791,852 | 2/1974 | Bunshah | 427/249 X |
| 3,912,826 | 10/1975 | Kennedy | 427/13 X |
| 4,107,352 | 8/1978 | Hakim | 427/50 |

FOREIGN PATENT DOCUMENTS

1416887 5/1973 United Kingdom .

Primary Examiner—Thurman K. Page
Attorney, Agent, or Firm—Mandel E. Slater

[57] ABSTRACT

A process is provided for the formation of metal and metal compound coatings on cutting edges by chemical vapor deposition in a deposition chamber, the improvement wherein a static electric field is established between the cutting edge and a counter electrode positioned in the deposition chamber, the field potential and gas pressure being such that glow discharge does not take place and the field potential additionally being such that a dense adherent coating is obtained.

6 Claims, 7 Drawing Figures $T/F = 1$ $T/F = 2$

×1000

×2000

FORMATION OF COATINGS ON CUTTING EDGES

FIELD OF THE INVENTION

This invention is concerned with the formation of metal and metal compound coatings on cutting edges, particularly those of razor blades, by chemical vapor deposition.

BACKGROUND OF THE INVENTION

Chemical vapor deposition (CVD) is a known technique for forming coatings of metals and metal compounds on a variety of substrates; it has been used, for example, in the production of tantalum and tungsten coatings on steels, silica coating on silicon, and titanium carbide and nitride coating on cemented carbide tools. The technique essentially comprises contacting the substrate to be coated with the vapor of a compound of the coating metal and, where a metal compound coating is to be formed which cannot be obtained by decomposition of the vaporised coating metal compound, a vaporised or gaseous compound which contains the additional element(s) required for the desired metal compound coating and where it is required to reduce the coating metal compound and/or the additional element(s)-containing compound, hydrogen, while maintaining the substrate at a temperature at which decomposition or reaction of the compound(s) takes place with formation of the desired coating. The use of CVD to form metal and metal compound coatings on razor blade cutting edges is described in British Specification No. 1,416,887; this specification gives examples of a number of different coatings and the compounds which can be used to form them and the disclosure of this specification is incorporated herein by reference.

CVD is carried out in a suitable deposition chamber at an elevated temperature and usually at a reduced pressure (as required or desirable in order to vaporise the compound(s) used). The deposition chamber may form part of a closed system with the means for supplying the vaporised metal compound or a flow system may be used in which fresh vaporised metal compound is supplied to the deposition chamber and decomposition or reaction products are removed therefrom. The latter type of system is usually preferred because it is more versatile, easier to operate and permits a greater degree of control to be maintained over the deposition parameters.

BRIEF DESCRIPTION OF THE DRAWINGS

In the following description reference will be made to the accompanying drawings, in which.

SUMMARY OF THE INVENTION

We have found that when conventional CVD conditions are used to form coatings on razor blade cutting edges which are of sufficient thickness (that is more than about 0.1 micrometers) to contribute significantly to the strength of the edge, the tip radius increases in proportion to the coating thickness and there is a significant loss of sharpness which is such as to necessitate re-sharpening of the blade. This is illustrated diagrammatically in FIGS. 1a and 1b.

Figure 1A:
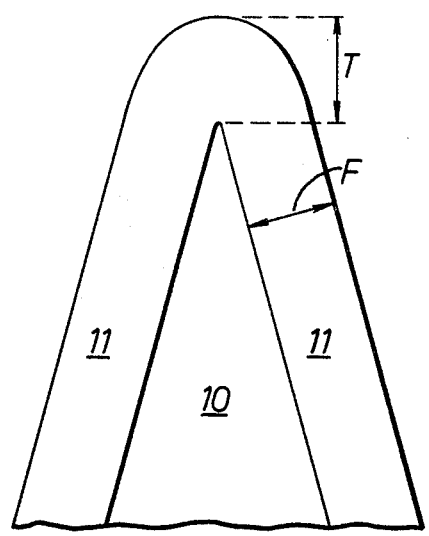
FIGS. 1a and 1b are diagrammatic sections of the tip of a razor blade cutting edge which has been coated by conventional CVD (1a) and illustrating the re-sharpening thereof (1b)
Figure 1B:
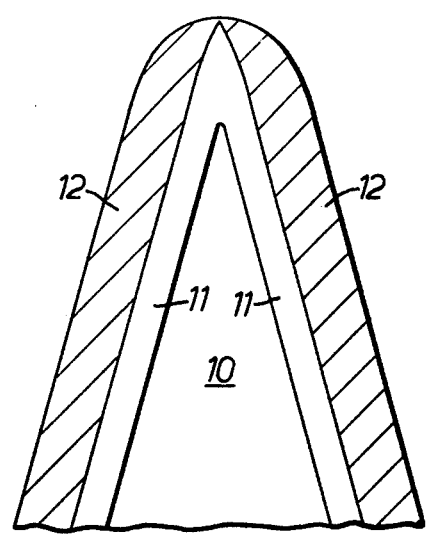

These Figures show the original sharpened cutting edge 10 and CVD coating 11 thereon. In FIG. 1b, the hatched area 12 represents the portion of the coating 11 which has to be removed in order to re-sharpen the edge.

We have found specifically that CVD carried out under conventional conditions produces approximately equal thickness of coating on the tip, T, and on the facets, F, which may be expressed in the form that the aspect ratio, T/F, of the coating is 1.

Since the primary interest in the CVD coating of cutting edges is the formation of very hard coatings, such as chromium carbide, molybdenum carbide or titanium carbide coatings which have hardnesses ranging from about 2000 to 3600 Hv, it will be appreciated that the re-sharpening of such coated cutting edges is difficult and time-consuming.

Figure 2A:
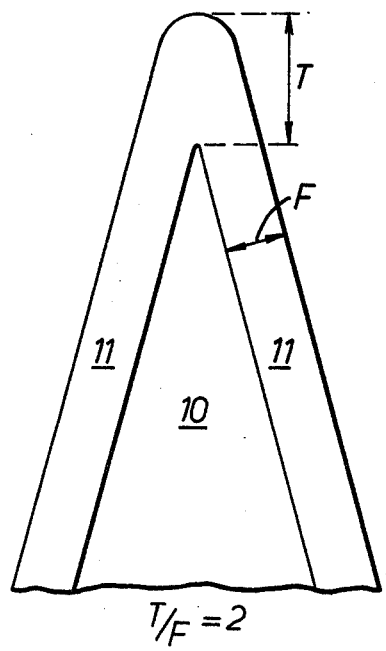
FIGS. 2a and 2b are similar sections of the tip of a razor blade cutting edge which has been coated by the process of the present invention (2a) and illustrating the re-sharpening thereof (2b)
Figure 2B:
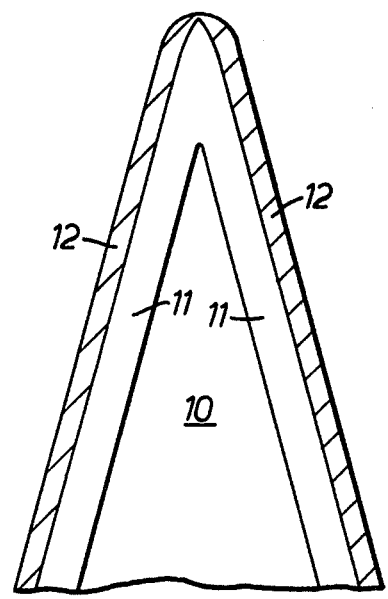

We have further found that the aspect ratio of a CVD coating on the cutting edge can be increased to a significant extent, for example to 2, by carrying out CVD with a static electric field established between the cutting edge and a counter electrode positioned in the deposition chamber, the field potential and gas pressure being such that glow discharge does not take place and the field potential additionally being such that a sense adherent coating is obtained. The effect of obtaining coating aspect ratios having values greater than 1 is to decrease the amount of coating material that has to be removed in resharpening the edge. This is illustrated in FIGS. 2a and 2b wherein the reference numerals have the same significance as in FIGS. 1a and 1b; it will immediately be seen that far less material has to be removed in order to resharpen the edge than is the case where the aspect ratio of the coating is 1 as shown in FIGS. 1a and 1b.

According to the present invention, therefore, we provide a process for the formation of metal and metal compound coatings on cutting edges by chemical vapor deposition, in which a static electric field is established between the cutting edge and a counter electrode positioned in the deposition chamber, the field potential and gas pressure being such that glow discharge does not take place and the field potential additionally being such that a dense adherent coating is obtained.

The counter electrode may take any convenient form. One arrangement we have found convenient is to introduce the vaporised compound(s) and any inert gas used in the CVD process into the deposition chamber through one or more metal inlet pipes which are electrically insulated from the deposition chamber and are connected as the counter electrode. In a preferred arrangement of this kind, each gas inlet pipe is arranged parallel to the longitudinal axis of a stack of razor blades to be treated and has a row of holes along its length through which the vapor/gas passes out of the pipe, the row being substantially coextensive with the length of the razor blade stack. One or more exhaust gas outlet pipes are also provided which have similar rows of holes and are also arranged parallel to the longitudinal axis of the razor blade stack, the outlet pipe(s) being positioned on the other side of the stack from the inlet pipe(s). Thus, in a system for treating double edged blades, the inlet holes face the cutting edges and the exhaust holes face the ends of the blades. In this way, the vapor/gas flows through the deposition chamber in a direction parallel to the blade edges and concentration gradients along the length of the blade stack, which would produce poor coating uniformity, are thereby prevented.

The field potential may be either positive or negative with respect to the cutting edge being treated. It is generally convenient to connect the cutting edge to ground and to make the counter electrode either anodic or cathodic relative to the cutting edge.

As indicated above, the field potential and the pressure in the deposition chamber should be such that glow discharge does not take place. For any particular operating pressure, it is found that there is a minimum voltage which will initiate glow discharge and a field voltage of less than this minimum must be used. A curve showing the relationship between operating pressure and the minimum voltage to initiate glow discharge for a particular set of CVD conditions is referred to below, by way of example; those skilled in the art will have no difficulty in determining what field voltages can be used for other sets of operating conditions.

Figure 3:
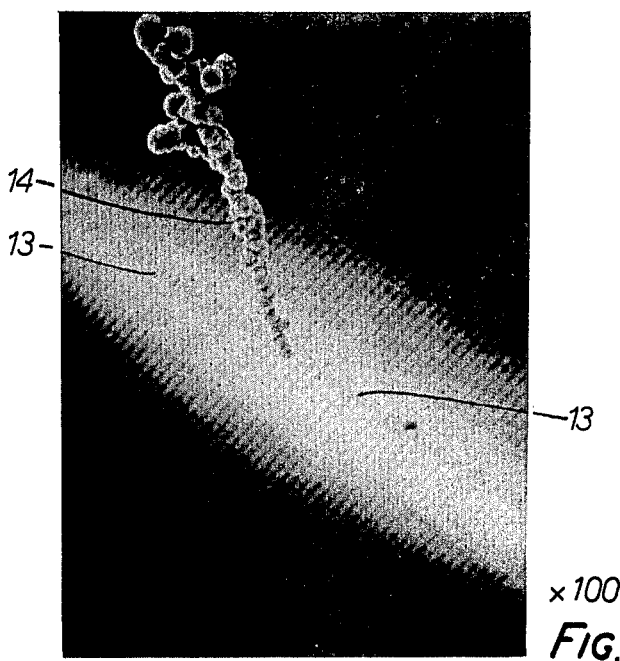
FIGS. 3 and 4 are photomicrographs at magnifications of ×1000 and ×2000 respectively of tree growths as described below.
Figure 4:
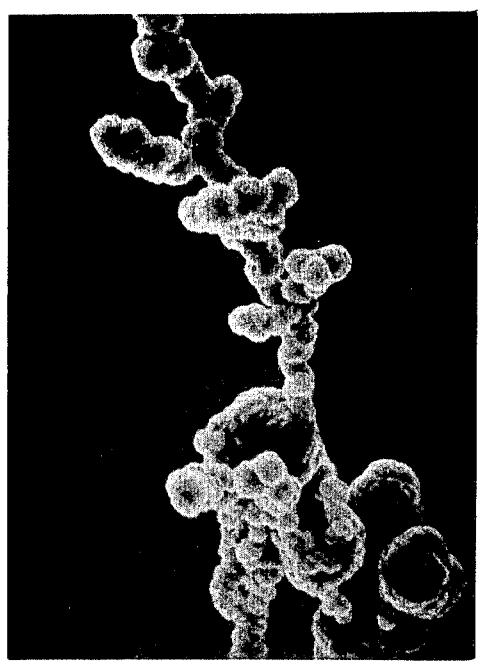

There is a further limitation upon the magnitude of the field voltage. If it is too high, it is found that a dense adherent coating is not formed at the tip of the cutting edge, but rather a relatively thin coating which is characterised by the formation of nodular "trees" extending several millimeters from the cutting edge tip. FIGS. 3 and 4 of the accompanying drawings are photomicrographs at magnifications of ×1000 and ×2000 respectively of typical tree growths of this kind. The tip of the cutting edge can be discerned in FIG. 3 as the line 13 running substantially diagonally across the photograph to which, at one point, the base of the "tree" 14 is attached.

The voltage at which this phenomenon occurs depends on the particular CVD conditions used, but can be readily determined by routine trial by those skilled in the art. Higher positive voltages can be used than negative voltages, that is the phenomenon of tree growth occurs at smaller negative voltages than positive voltages. Suitable blade voltages will usually be up to +2 kV and up to −0.5 kV.

In order that the invention may be more fully understood, the following example is given by way of illustration only.

EXAMPLE

CVD was carried out on a stack of sharpened stainless steel razor blades in a glass deposition chamber which could be evacuated to a controlled pressure using an Edwards pumping system and pressure controller. The blade stack was held on an electrically heated knife, the temperature of which was controlled by a Eurotherm proportional controller via a thermocouple welded to one of the blade edges. The vaporised metal compounds ($Cr(CO)_6$ and $Mo(CO)_6$, see below) and an inert carrier gas (nitrogen) were introduced into the chamber via two inlet pipes, each parallel to the blade edges and having a row of holes facing the blade edges. Gaseous reaction products were removed from the chamber through two outlet pipes, also parallel to the stack and having a row of holes facing the blade ends and positioned on the other side of the stack from the inlet pipes.

The two inlet pipes passed through and were electrically insulated from the base plate of the chamber and were connected to a high voltage d.c. supply via a vacuum connector in the base plate. The inlet pipes could be made either anodic or cathodic relative to the blade stack which was held at ground potential.

CVD of chromium/molybdenum carbide is typically carried out under the following conditions:
  substrate temperature: 375° C.
  vapor/gas supply: nitrogen saturated with $Cr(CO)_6$ and $Mo(CO)_6$ at 30° C.
  flow rate: 100 mls/min
  chamber pressure: 0.4 torr
  deposition time: 30 min.

This produces an alloy carbide coating 2 μm thick with a typical composition, by weight, of 80% $Cr_2C$ and 20% $Mo_2C$.

Figure 5:
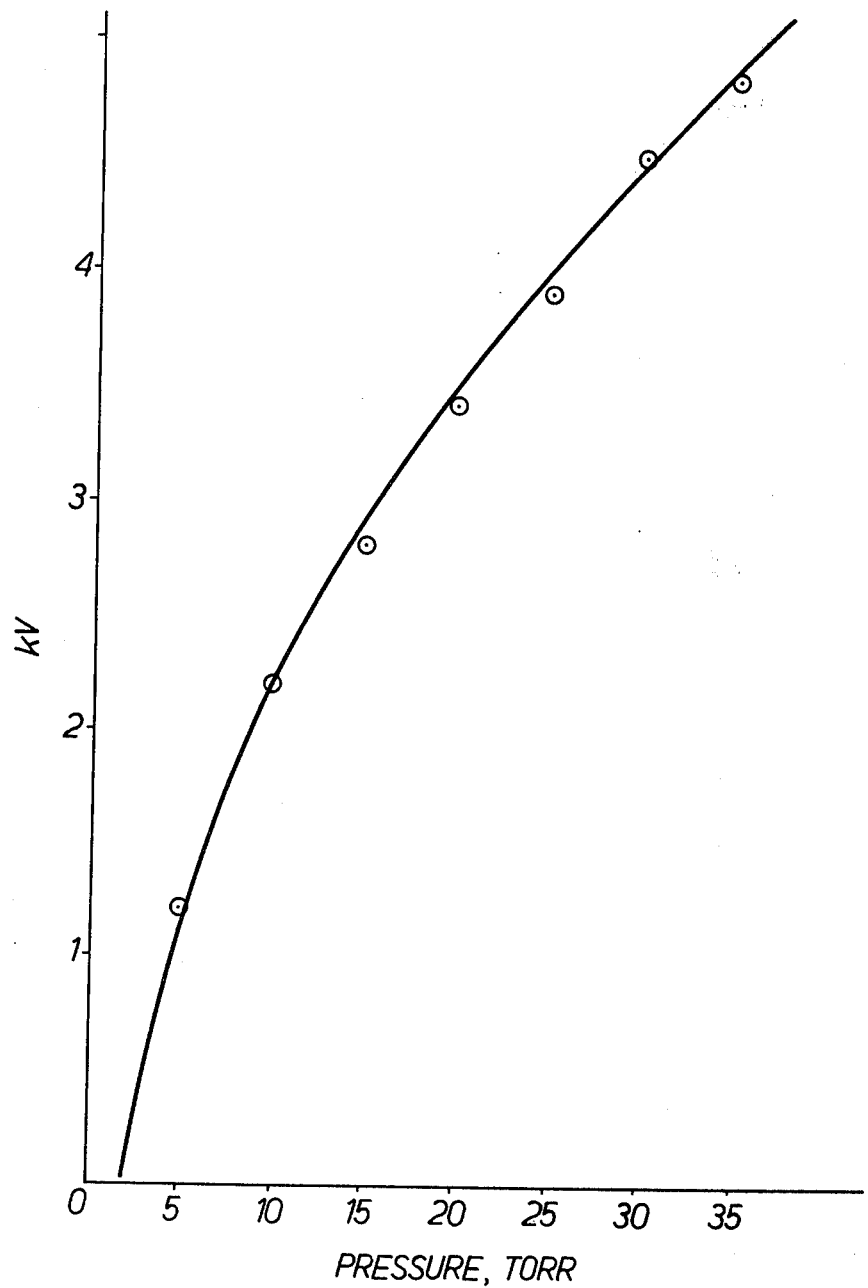
FIG. 5 is a curve obtained by plotting minimum voltage required to initiate glow discharge against operating pressure.

A series of runs was first carried out with the apparatus and system described above and using the typical chromium/molybdenum carbide CVD conditions just mentioned, except that the chamber pressure was varied. The runs were carried out at various voltages and chamber pressures to determine the minimum voltages required to initiate glow discharge over a range of pressures from 1 to 35 torr. The results obtained are shown graphically in FIG. 5 which is a curve obtained by plotting the minimum voltages, in kV, against the pressure, in torr. It will be understood that all combinations of voltages and pressure above and to the left of the curve will give rise to glow discharge, while all combinations below and to the right of the curve will not.

At the higher pressures used, that is at 30 torr and above, the rate of deposition was reduced and to obtain a coating 2 μm thick, it is necessary to increase the deposition time to 2 hours.

A further series of runs was then carried out using voltages ranging from 0 to +4 kV and from 0 to −4 kV and in each case a chamber pressure such that glow discharge did not take place. Following completion of deposition, sample blades from each run were sectioned perpendicularly to the cutting edge by a standard metallographic technique and the sections were examined with a scanning electron microscope and the aspect ratios, T/F of the coatings were measured.

The results obtained are summarised in the following Table.

| Run No. | Blade Voltage | T/F | |
|---|---|---|---|
| 1 | +4kV | — | Tree growth |
| 2 | +3kV | 2.2 | " |
| 3 | +2mV | 1.88 | Normal deposit |
| 4 | +1.4kV | 1.91 | " |
| 5 | +1kV | 1.81 | " |
| 6 | +0.5kV | 2.00 | " |
| 7 | 0 | 1.20 | " |
| 8 | −0.5kV | 2.00 | " |
| 9 | −1kV | — | Tree growth |
| 10 | −2kV | — | " |
| 11 | −3kV | — | " |
| 12 | −4kV | — | " |

What is claimed is:
1. In a process for the formation of metal and metal compound coatings on cutting edges by chemical vapor deposition in a deposition chamber, the improvement wherein a static electric field is established between the cutting edge and a counter electrode positioned in the deposition chamber, the field potential and gas pressure being such that glow discharge does not take place and the field potential additionally being such that a dense adherent coating is obtained.

2. A process as set forth in claim 1, wherein the vaporised compound and any inert gas used in the chemical vapor deposition process are introduced into the deposition chamber through at least one metal inlet pipe which is electrically insulated from the deposition chamber and is connected as the counter electrode.

3. A process as set forth in claim 2 for the coating of razor blade cutting edges, wherein each gas inlet pipe is arranged parallel to the longitudinal axis of a stack of razor blades to be treated and has a row of holes along its length through which the vapor/gas passes out of the pipe, the row being substantially coextensive with the length of the razor blade stack, and at least one exhaust gas outlet pipe is also provided which has a similar row of holes and is also arranged parallel to the longitudinal axis of the razor blade stack, the outlet pipe being positioned on the other side of the stack from the inlet pipe.

4. A process as set forth in claim 1, wherein the cutting edge voltage is positive and is up to +2 kV.

5. A process as set forth in claim 1, wherein the cutting edge voltage is negative and is up to −0.5 kV.

6. A process for the formation of metal and metal compound coatings on cutting edges by chemical vapor deposition in a deposition chamber, which comprises carrying out the chemical vapor deposition in the presence of a static electric field established between the cutting edge and a counter electrode positioned in the deposition chamber and in the absence of glow discharge whereby a dense adherent coating having an aspect ratio of about 2 is obtained on the cutting edge.

* * * * *